United States Patent
Usenko et al.

(10) Patent No.: US 6,346,459 B1
(45) Date of Patent: Feb. 12, 2002

(54) PROCESS FOR LIFT OFF AND TRANSFER OF SEMICONDUCTOR DEVICES ONTO AN ALIEN SUBSTRATE

(75) Inventors: Alexander Y Usenko, Murray Hill; William N. Carr, Montclair, both of NJ (US)

(73) Assignee: Silicon Wafer Technologies, Inc., Newark, NJ (US)

( * ) Notice: Subject to any disclaimer, the term of this patent is extended or adjusted under 35 U.S.C. 154(b) by 0 days.

(21) Appl. No.: 09/496,597

(22) Filed: Feb. 2, 2000

Related U.S. Application Data

(60) Provisional application No. 60/118,746, filed on Feb. 5, 1999.

(51) Int. Cl.[7] .......................... H01L 21/30; H01L 21/46
(52) U.S. Cl. ..................................... 438/458; 438/520
(58) Field of Search ................................ 438/406, 407, 438/455, 458, 526, 528, 977, 295, 479, 520, 795

(56) References Cited

U.S. PATENT DOCUMENTS

| | | | | |
|---|---|---|---|---|
| 4,391,651 A | * | 7/1983 | Yoder .......................... | 438/520 |
| 4,846,931 A | | 7/1989 | Gmitter et al. ............. | 156/633 |
| 5,374,564 A | | 12/1994 | Bruel .......................... | 437/24 |
| 5,863,830 A | | 1/1999 | Bruel et al. ................. | 438/478 |
| 5,882,987 A | * | 3/1999 | Srikrishnan ................. | 438/458 |
| 5,953,622 A | * | 9/1999 | Lee et al. .................... | 438/458 |
| 6,211,041 B1 | * | 4/2001 | Oruga ......................... | 438/458 |

FOREIGN PATENT DOCUMENTS

WO  WO98/33209   7/1998

OTHER PUBLICATIONS

Applied Physics Letters, vol. 73, No. 19, Nov. 9, 1998, pp. 2772–2774, C. H. Yun et al., "Transfer of Patterned Ion–cut Silicon Layers".

Electronics Letters, vol. 32, No. 21, Oct. 10, 1996, pp. 1985–1986, B. Aspar et al., "Transfer of Structured and Patterned Thin Silicon Films Using the Smart–Cut® Process".

J. Micromech. Microeng., vol. 7 (1997) pp. 108–110, S. van der Groen, et al., "Substrate Bonding Techniques for CMOS Processed Wafers".

* cited by examiner

Primary Examiner—David Nelms
Assistant Examiner—Phuc T. Dang

(57) ABSTRACT

The method of the invention causes fracture of a semiconductor layer containing semiconductor devices from a support layer and requires no masking of the semiconductor device features during an implantation action. The method initially implants protons throughout an entirety of the semiconductor layer at an energy level that enables the protons to reach a depth that defines a delamination region. The implanting creating defects in the semiconductor devices and charge accumulation in dielectric portions (if any). Next a heat treating step causes a delamination of the semiconductor layer from the support layer that lies beneath the delamination region. Then the semiconductor layer is annealed at a temperature that exceeds a thermal stability temperature of the defects to cause a healing thereof.

20 Claims, 2 Drawing Sheets

US 6,346,459 B1

PROCESS FOR LIFT OFF AND TRANSFER OF SEMICONDUCTOR DEVICES ONTO AN ALIEN SUBSTRATE

This Application claims priority from Provisional Application Ser. No. 60/118,746, filed Feb. 5, 1999.

FIELD OF THE INVENTION

The present invention generally relates to processes for fabricating integrated circuits and, more particularly, to a method for integrating semiconductor devices prefabricated on different substrates using implant-induced cut, alignment, bonding onto a host substrate, and interconnecting the devices monolithically integrated.

BACKGROUND OF THE INVENTION

Monolithic integration of different types of semiconductor devices on certain substrates is difficult to realize because of the poisoning of a first type device by a processing step required to fabricate a second type device. The prior art describes several approaches to overcome this problem. In particular it is suggested to fabricate two types of devices respectively on separate substrates, and then to cut the first type of device from its substrate. The first type device is then positioned on a host substrate that contains prefabricated devices of the second type.

Conventional processes for lift off and transfer of semiconductor devices onto alien substrate includes the following sequence of steps:

Fabrication of the semiconductor device on a first substrate.

Protecting the devices that are to survive a succeeding cutting step by deposition of a protective coating.

Cutting a device-containing layer from the first substrate.

Placing the layer on a second substrate.

Fixing the device layer on the second substrate.

Removing the protective coating to release the semiconductor devices.

The prior art is represented by the following references: (1) U.S. Pat. No. 4,846,931 to Gmitter et al., "Method for Lifting-Off Epitaxial Films"; (2) "Transfer of Structured and Patterned Thin Films Using the Smart-Cut™ Process", Aspar et al., Electronic Letters, v.32, No.21, pp.1985–1986, 1996; (3) WO98/33209, Bruel et al., "Method for Obtaining a Thin Film, in Particular Semiconductor, Comprising a Protected Ion Zone and Involving an Ion Implantation" (1998); (4) "Substrate Bonding Techniques for CMOS Processed Wafers", van der Groen et al., J. Micromech.Microeng., v.7, pp.108–110, 1997; and (5) "Transfer of Patterned Ion-Cut Silicon Layers", C. H. Yun et al., Applied Physics Letters, V.73, No.19, pp.2772–2774, 1998.

The above cited prior art uses either a sacrificial layer etch (1) or an ion-cut (1,3,4,5) to delaminate the device containing layer. The older etch technique is limited to small area (~1 cm$^2$) device transferals. The newer ion-cut technique (1) allows batch processing and achieves wafer size device layer transferals. The ion-cut technique uses implantation of hydrogen (preferably in the form of protons) into the device containing wafer and the formation of a continuous embedded gaseous layer from the implanted hydrogen ions, thus releasing the top device layer from the rest of the wafer.

All known ion-cut techniques (1,3,4,5) avoid hydrogen implantation through sensitive device areas in the semiconductor device layer to be transferred. A protective layer is temporarily deposited on top of the sensitive device areas of each semiconductor device before the hydrogen implantation (3). Some processes protect only the most sensitive parts of the devices to be transferred. There are several disadvantages that result from the ion-cut-based process for device transfers to a new substrate. Among the disadvantages are lowered yields and device densities.

Accordingly, it is an object of the invention to provide an improved method for lift-off and transfer of semiconductor devices to new substrates.

It is another object of the invention to provide a method for lift-off and transfer of semiconductor devices to new substrates that requires less steps than prior art processes.

It is a further object of the invention to provide an improved method for lift-off and transfer of semiconductor devices to new substrates that does not require the deposition of protective layers during the lift-off process.

SUMMARY OF THE INVENTION

The process of the present invention does not employ protective layers during the lift-off process. All semiconductor devices are subjected to a proton implantation, causing the devices to become inoperable immediately after the implantation. This is due to an accumulation of defects in the devices during the implantation. The semiconductor devices incorporate metallic, dielectric, semiconductive, and interface portions. While the metallic portions are not affected by the implantation, the remaining portions are. The dielectric portions accumulate positive or negative charges, the interfaces experience a rise in surface states and the semiconductor portions accumulate radiation-induced defects. Importantly, the invention makes use of the fact that all changes caused by the proton implantation are thermally unstable and are reversible. Accordingly, application of an additional thermal treatment to the semiconductor structure, in a temperature range (i.e., 425° C.–800° C.) that exceeds the thermal stability limit of the most stable defect introduced during implantation, enabling a reversal of the defects.

DESCRIPTION OF THE PREFERRED EMBODIMENT

Figure 1:
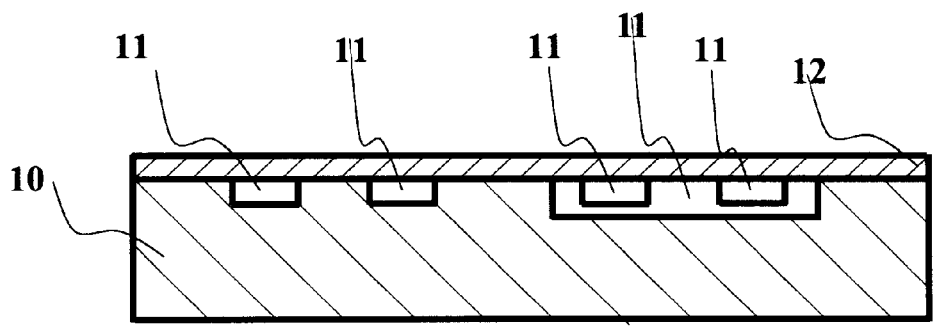
FIGS. 1–8 collectively illustrate the method of the invention.

The method of the invention provides for the lift-off of a thin film of semiconductor devices, with the film having a thickness typically between 0.1 and 10 micrometers. With reference to FIG. 1, a substrate 10 is provided with prefabricated semiconductor devices 11 and a planarizing layer 12. Semiconductor devices 11 are formed using any conventional process, for example a standard CMOS process. Planarizing layer 12 is used if the device surface contain high steps (steps more then about 10% of overall device thickness). In the preferred embodiment, substrate 10 is silicon and device layer 11 is a CMOS structure. Planarizing layer 12 is silica glass, $SiO_2$ or polysilicon deposited at a relatively low temperature.

Proton implantation is then used to define a depth of device layer to be lifted-off. The ion implantation dose is between $5*10^{16}$ ions/cm$^{-2}$ and $2*10^{17}$ ions/cm$^{-2}$. Energy is calculated through use of the expression E=100 h, where E is the proton energy in keV, and h is the total thickness of the device layer 11 and planarizing layer 12 in micrometers.

Protons are used for implantation because of their light mass, i.e., between 14 and 16 times lighter than the target atomic masses (mostly silicon and oxygen). After reaching the target surface, the proton ions come into contact with the heavier target atoms and lose energy. When the energy of the proton ions drops to tens of keV, the probability of losing energy from atomic displacement becomes dominant. At this point each proton experiences a displacement cascade which occurs at the end of the proton track. Accordingly, there is only light lattice damages within the CMOS structure after the implantation treatment.

However, ionization losses do cause a positive charge to accumulate in the CMOS dielectric portions. The dangling bonds of silicon and oxygen within the $SiO_2$ layer cause a trapping of holes (and positive charge). Also, there are states at the Si—$SiO_2$ interface that also act as charge traps. The resulting positive charge causes a threshold voltage shift in the CMOS circuitry that is undesirable.

However, succeeding steps of the process include at least one elevated temperature step. The traps maintain their charge state up to a given temperature, and if heated over that temperature, lose the trapped charge. That temperature is in excess of 400° C. in Si—$SiO_2$ systems. The CMOS threshold voltages are then restored to their initial design values. Thus the CMOS survives intact and operational when subjected to a complete implantation-induced lift-off- and bond process.

Figure 2:
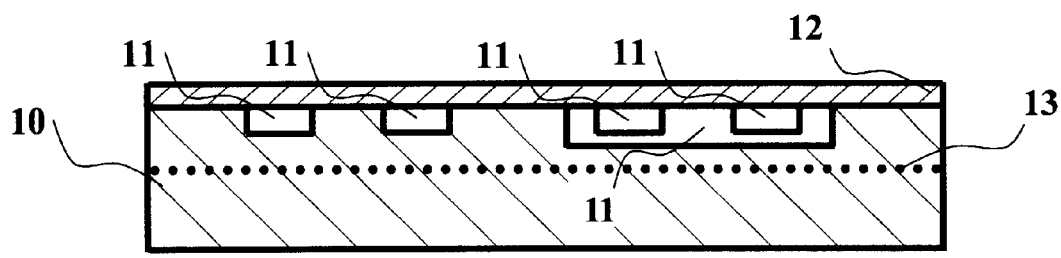

FIG. 2 shows semiconductor structure 10 after a proton implantation step. Note that there is no ion masking provided over the device structures. The implantation creates a layer 13 beneath the device surface where the implanted protons stop and form a hydrogen-enriched layer 13. Layer 13 transforms, under thermal annealing, to form gaseous microbubbles. If there are enough microbubbles, they form a continuous gaseous layer. The semiconductor structure thus divides into a bottom silicon substrate 10a and a top device-containing layer 10b, as shown in FIG. 3.

If the proton energy is lower than about 400 keV (i.e., the protons stops at depths less than 4 micrometers), additional steps must be taken to assure that substrate 10 divides completely along the desired plane. The mechanical strength of the top layer must be strengthened, otherwise it blisters, and the CMOS circuitry experiences fracture.

Figure 3:
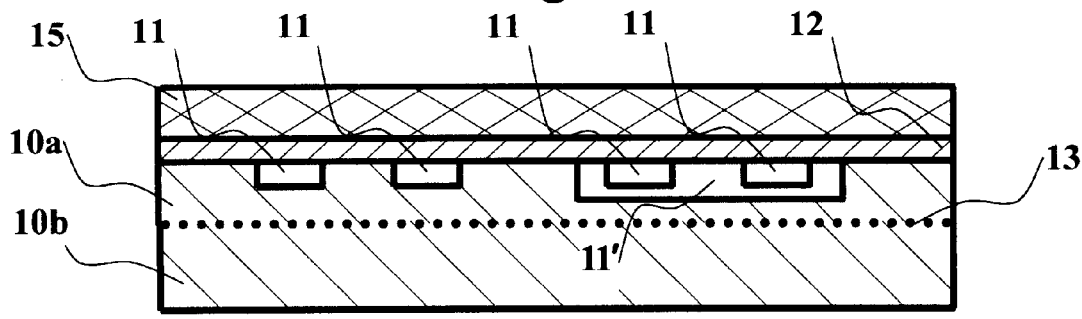

FIG. 3 shows a next step of the process that deals with the low proton energy case. The structure is covered with adhesive coating 15. Coating 15 is preferably made from a polyimide or other material that has chemical properties different from Si and $SiO_2$. The difference allows selective removal of coating 15 after the implant-induced cut is completed. For high proton deposition energies, this coating step can be skipped. The process step of FIG. 3 can achieve another goal. The 4–20 micrometers device-containing layer 10a, after the implant-induced cut, is difficult to handle using standard semiconductor equipment, that is designed to handle 500–1000 micrometer wafers. So, coating layer 15 can be used to adjust the thickness of the part that contains layers 10a and 15 to the standard wafer thickness.

Figure 4:
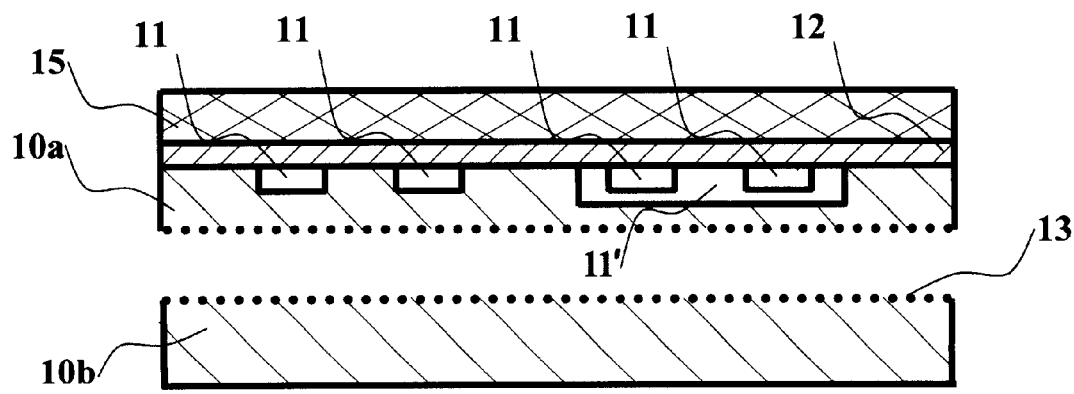
Figure 5:
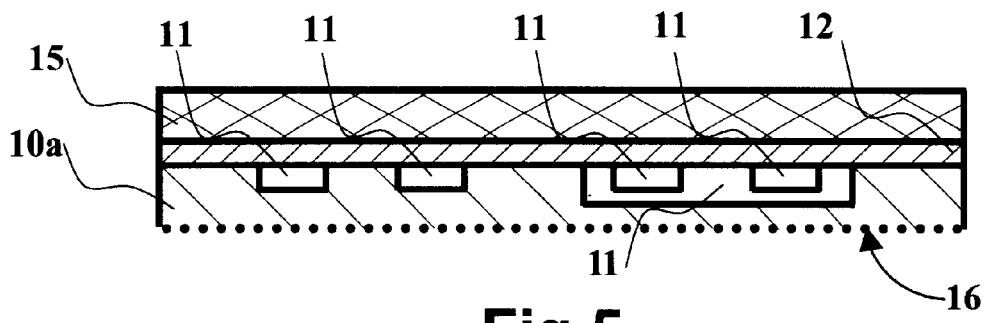

Next, (FIG. 4) a thermal treatment is applied to the device to cause expansion of the entrapped gases and a fracture of the substrate along surface 13 (i.e., 400° C. or less. Then, (FIG. 5) a surface smoothing step is performed to improve the flatness of bottom surface 16 of wafer 10a. The relief of surface 16 is controlled by the microbubble average size. For example, if a $10^{17}$ cm$^{-2}$ proton dose is used, it results in about 10 atomic layers of molecular hydrogen inside the silicon wafer, and it further provides a surface roughness of about 50 Å. Since wafer 10a is to be directly bonded to a host substrate, surface 16 should be atomically flat to ensure high yield bonding.

The smoothing step is performed in accord with the process described, for example, in "Semiconductor Wafer Bonding", Gösele et al. Wiley, 1998. The final roughness is about 5 Å. Alternatively, an annealing in hydrogen ambient can be performed at a temperature that assures semiconductor device survival (i.e., up to 800° C. for CMOS, as the CMOS does not contain metallization at this stage). The anneal initiates surface diffusion that begins at about ~500° C., and enables a quasi-epitaxial re-growth of the damaged surface and subsurface regions. The process provides a surface that is close to atomically flat (i.e., better than 5 Å microroughness).

Figure 6:
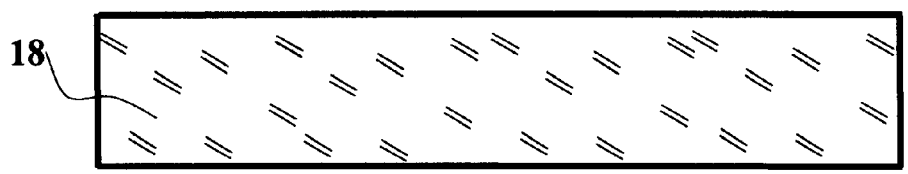

A similar smoothing process is performed for the host substrate 18 in FIG. 6. Then the surfaces to be bonded are prepared for direct bonding in the same manner as is used for conventional wafer bonding (see Gösele et al.) by soaking for 1 min in a mixture of $H_2SO_4(97\%):H_2O_2(30\%)$ (4:1) with 10 ppm of HF added. The temperature of the solution is approximately ~100° C. due to heat produced during the reaction. This treatment renders the surface (either bare silicon or thermally oxidized) hydrophobic, i.e. the solution does not wet the surface when the wafer is removed from the bath. Then the wafers are rinsed for 2 min. in DI water. Such action turns the surfaces hydrophilic. Then, blow drying in $N_2$ is performed. The activated surfaces keep their hydrophilic properties for a limited time, typically about an hour.

Figure 7:
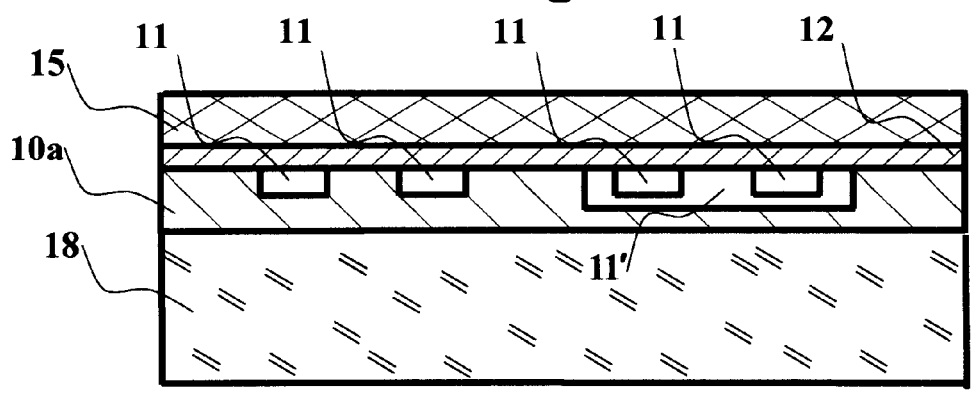

Immediately after drying, host wafer 18 and wafer 10a are brought together (FIG. 7). A conventional alignment technique is used during this bonding step. Next, the assembly is annealed to both strengthen bonds between the bonded surfaces and to restore threshold voltages and other electrical characteristics of the CMOS devices. An anneal temperature range of 425° C. to 800° C. is preferred, with a temperature of 425–450° C. preferred for a CMOS structure containg metal conductors(i.e., below 470° C. where aluminum alloys with silicon). At least 550° C.–800° C. is preferred for bipolar circuitry. The CMOS restoration is controlled by thermal stability of hole traps in $SiO_2$ and Si—$SiO_2$ interfaces (in excess of 350° C.). The bipolar device restoration is controlled by the thermal stability of point radiation-induced defects in silicon (about 550° C.). When heated over those temperatures, it has been found that all defects are annealed out, and expected electrical performance is completely restored. The anneal temperature maximum is typically limited by thermal diffusion effects and eutectic formation that degrade device performance. For example, if the upper film contains no conductive structures (metal or low temperature silicide), then solid-state diffusion effects will generally determine the maximum anneal temperature, which can be as high as 800° C. For optoelectronics, MEMS, and GaAs circuitry the restoration temperatures vary.

The bond strength achieved by the above process exhibits a bonded plane durability that is equal to bulk silicon at temperatures up to ~1000° C. However, even a ~500° C. anneal provides a bond strength that is sufficient to ensure device integrity and proper performance of the finished integrated circuit under reasonable mechanical and thermal stresses.

Figure 8:
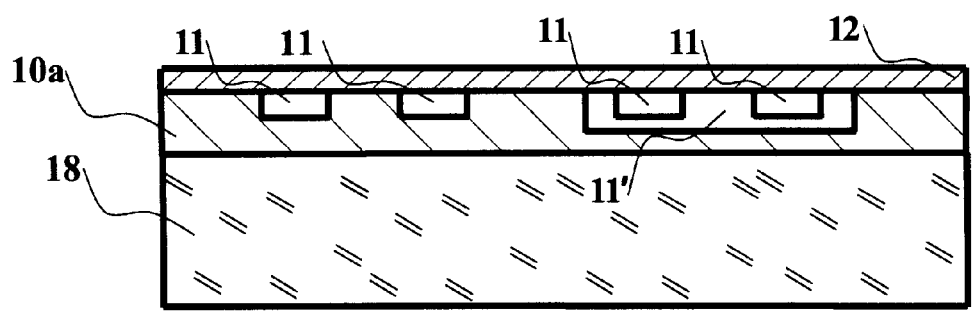

Next, layer 15 is removed and an interconnection fabrication step is performed (FIG. 8) using conventional processing (e.g., contact window etching, metallization, aluminum, polysilicon, or other conductor deposition, and patterning) and final device passivation layer deposition.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A method comprising:

implanting protons through at least one semiconductor device and into a layer of semiconductor, wherein the implanted protons form a hydrogen-enriched sub-layer within said layer of semiconductor;

heating said layer of semiconductor to a temperature that is sufficient to cause said layer of semiconductor to fracture at said hydrogen-enriched sub-layer thereby separating said layer of semiconductor into a first portion and a second portion, wherein said semiconductor device depends from said first portion; and healing defects in said semiconductor device that were caused when said protons were implanted therethrough.

2. The method of claim 1 wherein, during said operation of heating, said temperature does not exceed about 400° C.

3. The method of claim 1 wherein said healing comprises heating said semiconductor device.

4. The method of claim 1 wherein said semiconductor device is a CMOS structure.

5. The method of claim 1 wherein said protons that are implanted have an energy of at least about 400 keV.

6. The method of claim 1 wherein said protons that are implanted have an energy of less than about 400 keV, the method further comprising strengthening said first portion and said semiconductor device before said layer of semiconductor is heated.

7. The method of claim 6 wherein said operation of strengthening further comprises disposing a coating over said semiconductor device.

8. The method of claim 6 further comprising smoothing a surface of said first portion.

9. The method of claim 8 further comprising bonding the smoothed surface of said first portion to a substrate before said defects are healed.

10. A method comprising:

forming a hydrogen-enriched sub-layer within a semiconductor layer, wherein said semiconductor layer includes a plurality of semiconductor devices that are reversibly damaged during the formation of said hydrogen-enriched sub-layer;

physically separating said semiconductor layer, at said hydrogen-enriched sub-layer, into a first portion and a second portion, wherein said first portion includes said plurality of semiconductor devices; and annealing said first portion of said semiconductor layer at a temperature that is sufficient to heal the reversibly-damaged semiconductor devices.

11. The method of claim 10 wherein the operation of forming comprises implanting protons through said plurality of semiconductor devices and into said semiconductor layer.

12. The method of claim 10 wherein the operation of physically separating comprises heating said semiconductor layer to cause it to fracture.

13. The method of claim 12 wherein said semiconductor layer is heated to a temperature that is less than about 400° C.

14. The method of claim 10 wherein the operation of annealing comprises heating said first portion of said semiconductor layer to a temperature within a range of about 425° C. to about 800° C.

15. The method of claim 10 further comprising bonding said first portion of said semiconductor layer to a substrate.

16. The method of claim 10 wherein said first portion has a thickness in a range of about 0.1 to 10 microns.

17. A method comprising:

implanting hydrogen in a layer of semiconductor, wherein said hydrogen passes through a semiconductor device during implantation;

heating the implanted hydrogen to a temperature that is sufficient to cause said layer of semiconductor to separate into a first portion and a second portion, wherein said semiconductor device is proximal to said first portion; and heating said first portion and said semiconductor device to a temperature that is sufficient to heal defects that were caused when said hydrogen was implanted.

18. The method of claim 17 wherein said implanted hydrogen is in a range between about $5 \times 10^{16}$ and $2 \times 10^{17}$ ions per square centimeter of semiconductor.

19. The method of claim 17 further comprising bonding said first portion to a substrate.

20. The method of claim 17 wherein said semiconductor device is selected from the group consisting of a CMOS device and a bipolar device.

* * * * *